(12) United States Patent
Green

(10) Patent No.: US 7,419,908 B2
(45) Date of Patent: *Sep. 2, 2008

(54) PROCESS FOR MAKING AN ARRAY OF WELLS

(75) Inventor: Mino Green, London (GB)

(73) Assignee: Imperial Innovations Limited, London (GB)

(*) Notice: Subject to any disclaimer, the term of this patent is extended or adjusted under 35 U.S.C. 154(b) by 0 days.

This patent is subject to a terminal disclaimer.

(21) Appl. No.: 11/352,517

(22) Filed: Feb. 10, 2006

(65) Prior Publication Data

US 2006/0131261 A1 Jun. 22, 2006

(51) Int. Cl.
*H01L 21/302* (2006.01)
*H01L 21/461* (2006.01)

(52) U.S. Cl. .............. 438/689; 438/706; 438/714; 438/717; 438/723; 438/745; 438/752

(58) Field of Classification Search ............ 438/689, 438/706, 714, 717, 723, 5, 752
See application file for complete search history.

(56) References Cited

U.S. PATENT DOCUMENTS 6,153,010 A    11/2000   Kiyoku et al.
7,033,936 B1 *  4/2006   Green ............... 438/669

OTHER PUBLICATIONS

Haginoya et al., "Nanostructure array fabrication with a size-controllable natural lithography", 1997, p. 2934-2936.

Green et al., "Quantum pillar structures on n+ gallium arsenide fabricated using 'natural' lithograph", 1993, pp. 264-266.

H. Fang, R. Zella and P. J. Stiles, "Fabrication of quasi-zero-dimensional submicron dot array and capacitance spectroscopy in a GaAs/AlGaAs heterostructure", Applied Physics Letters, vol. 55, 1433 (1989).

A. A. G Driskill-Smith, D. G. Hasko and H. Ahmed, "Fabrication and behavior of nanoscale field emission structures", J. Vac. Sci. Technol B, 15, 2273(1997).

A. A. G. Driskill-Smith, D. G. Hasko and H. Ahmed., "Nanoscale field emission structures for ultra-low voltage operation at atmospheric pressure", Applied Physics Letters, vol. 71, 3159 (1997).

(Continued)

*Primary Examiner*—Duy-Vu N Deo
(74) *Attorney, Agent, or Firm*—Fay Sharpe LLP

(57) ABSTRACT

A method of fabricating electronic, optical or magnetic devices requiring an array of large numbers of small feature in which regions defining individual features of the array are foamed by the steps of: (a) depositing a very thin film of a highly soluble solid onto a flat hydrophilic substrate; (b) exposing he film to solvent vapor under controlled conditions so that the film reorganizes into an array of discrete hemispherical islands on the surface; (c) depositing a film of a suitable resist material over the whole surface; (d) removing the hemispherical structures together with their coating of resist leaving a resist layer with an array of holes corresponding to the islands; and (e) subjecting the resulting structure to a suitable etching process so as to form a well at the position of each hole. The wells which are formed by this process may be used to fabricate various types of devices, including arrays of semiconductor devices, and crystalline heterostructures in which the lattice constants of the component materials are different.

18 Claims, 6 Drawing Sheets

OTHER PUBLICATIONS

Francois Foulon and Mino Green, "Laser projection patterned etching of (100) GaAs by gaseous HCl and CH3Cl", Appl. Phys A, 60, 377-381 (1995).

H. Dimigen and H. Luthe, "An Investigation of ion etching", Philips Tech. Rev., Rev., 35, 199 (1975).

R. A. Stradling, "Novel Semiconductor Material prepared by MBE & MOCVD", Invited Talk at EPS Condensed Matter Conference (Lisbon) Physica Scripta, vol. T35, 237-244 (1991).

K. Kamisawa, H Yamaguchi & Y Hirayama, "Two dimensional growth of InSb thin films on GaAs (111) A substrates", App Phys Lett, vol. 76, 589 (2000).

T A Langdo, C W Leitz, M T Currie, E A. Fitzgerald, A Lochtefeld & D A Amoniadis, "High quality Ge on Si by Epitaxial Necking" Applied Physics Letters, vol. 76 3700 (2000).

L Vescan. C Dicker, A Hartman & A van der Hart, "Si/Si Ge dots grown by selective epitaxy", Semiconductor Science & Technology 9 387 (1994).

E S Kim N Uami & Y Shiraki, "Selective epitaxial growth of dot structures on patterned Si substrates by gas source molecular beam epitaxy", Semiconductor Science & Technology 14 257 (1999).

O Nam, M Bremser, T A Zheleva & R F Davis, "Lateral epitaxy of low defect density GaN layers via organometallic vapour phase epitaxy", Applied Physics Letters, vol. 71, 2638 (1997).

J Park. P A Grudowski, C J Eitnig & R D Dupuis, "Selective area and lateral epitaxial overgrowth of III-N materials by metal organic chemical vapour deposition", Applied Physics Letters, vol. 73, 333 (1998).

K Linthicum, T Gehrke, D Thomson, E Carlson, P Rejagopal, T Smith, D Batchelor & R Davis, "Pendeoepitaxy of gallium nitride thin films", Applied Physics Letters, vol. 75, 196 (1999).

Shin Tsuchiya, Mino Green and R R A Syms, "Structural Fabrication Using Cesium Chloride Island Arrays as Resist in a Fluorocarbon Reactive Ion Etching Plasma", Electrochemical and Solid-State Letters 3, 4464 (2000).

F. Khaleque, "E-beam lithography and dry processing for sub-micron fabrication" PhD Thesis (Electrical Engineering Department Imperial College) University of London, 1990. M. F. Garcia-Parajo, "Natural lithography based on alkali-halide thin films for semiconductor sub-micron fabrication" PhD Thesis (Electrical Engineering Department, Imperial College) University of London 1993.

Y B Xu, E T M Kernohan, M Teslepi, J A C Bland & S Holmes, "Single crystal Fe films groown on InAs (001) by molecular beam epitaxy", Applied Physics Letters, vol. 73, 399 (1998).

Y B Xu, D J Freeland, E T Kernohan, W Y Lee, M Teslepi, C M Guertier, C A F Vaz, J A C Bland, S Holmes, N K Patel & D A Ritchie, "Ferromagnetic metal/semiconductor hybrid structures for magnetoelectronics", J. App. Phys., vol. 85, 5369 (1999).

H Ohno, "Making Nonmagnetic Semiconductors Ferromagnetic", Science, vol. 281, 951 (1998).

F Schippan, M Kastner, L Daweritz & K H Ploog, "Growth control of MnAs on GaAs (001) by reflection high-energy electron diffraction", Applied Physics Letters, vol. 76, 834 (2000).

H Akinaga, S Miyanishi, W van dRoy, J de Boeck & G Borghs, "Influence of GaAs (001) surface termination on the n-plane magnetic anisotropies of MnSb epitaxial films" Applied Physics Letters, vol. 73, 3285 (1998).

J A Caballero, Y D Perk, A Cabbibo, J R Childress, F Petroff & R Morei, "Deposition of high-quality NiMnSb magnetic films at moderate temperatures", J. App. Phys., vol. 81, 2740 (1997).

J F Bobo, P R Johnson, M Kautzky, F B Mancoff, E Tuncci, R. L. White & B M Clemens, "Optical spectroscopy of half metallic ferromagnetic Heusler alloy thin films, PtMnSb, NiMnSb & CuMnSb", J. App. Phys., vol. 81, 4164 (1997).

X Gao, J A Woollam, R D Kirby, D J Sellmyer, C T Tanaka, J Nowak & J S Moodera, "Dielectric tensor for magneto-optic NiMnSb", Phys Rev, vol. 59B, 9965 (1999).

K Mastonardi, D Yound, C C Wang, P Khalifah. R J Cava & A P Ramirez, "Antimonides with the half-Heusler structure; new thermoelectric materials", Applied Physics Letters, vol. 74, 1415 (1999).

T Ambrose, J J Krebs & G A Prinz, "Epitaxial growth and magnetic properties of single crystal C02MnGe Heusler alloy films on GaAs (001)", Applied Physics Letters, vol. 76, 3280 (2000).

W J DeSisto, P R Broussard, T F Ambrose, B E Nadgorny & M S Osofaky, "Highly spin-polarised chromium dioxide thin films produced by chemical vapour deposition from chromyl chloride", Applied Physics Letters, vol. 76, 3789 (2000).

L Ranno, A Barry & J M D Coey, "Production and magnetotransport properties of CrO 2 films", J. Apps. Phys., 81, 5774 (1997).

K Eisenbeiser, J M Finder, Z, Yu, J Randani, J A Curless J A Hallmark, R Droopsd, W J Ooms, L Salem S Bradshaw & C D Overgaard, "Field effect transistors with SrTiO3 gate dielectric on Si", Applied Physics Letters, vol. 76, 1324 (2000).

P J Wellman, J M Garcia J L Feng & P M Petroff, "Giant magnetoresistance in a low temperature GaAs/MnAs nanoscale ferromagnet hybrid structure", Applied Physics Letters, vol. 73, 3291 (1998).

H Akinaga, M Mizuguchi, K Ono & M Oshima, "Room temperature thousand fold magnetoresistive change in MnSb granular films", Applied Physics Letters, vol. 76, 357 (2000).

M Mizuguchi, H Akinaga, K Ono & M Oshima, "Crystallographic and magneto-optical studies of nanoscaled MnSb dots grown on GaAs", Applied Physics Letters, vol. 76, 1743 (2000).

H Akinaga, M Mizuguchi, K Ono and M Oshima, "Room temperature photoinduced magnetoresistive effect in GaAs including MnSb nanomagnets", Applied Physics Letters, vol. 76, 2600 (2000).

D R Schmidt, A G Petujkhov, M Foygel, J P Ibbotson & S J Allen, "Fluctuation controlled hopping of bound magnetic polarons in Er:GaAs nanocomposites", Phys Rev Lett, vol. 82, 823 (1999).

R P Cowburn, A O Adeyeye & M E Welland, "Controlling magnetic ordering in coupled nanomagnetic arrays", New. Journal of Physics, 1, 116.1-16.0 (1999).

J I Martin et al., "Magnetisation reversal in long chains of submicronic Co dots", Applied Physics Letter, vol. 72, 255 (1998).

S A Solin, R Stradling, T Thin and A J Bennett, "Thin Horizontal Plane Hall Sensors for ReadHeads in Magnetic Recording", Meas. Sci. & Techn., 8, 1174-1181 (1997).

S A Solin, R A Stradling, J W Bennett, "Narrow gap semiconductor Hall Sensors for ReadHeads in Magnetic Recording", T Proc. Int Conf on Narrow Gap Semiconductors (Shanghai) World Scientific (1997) P249.

Mino Green and Shin Tsuchiya, "Mesoscopic hemisphere arrays for use as resist in solid state structure fabrication", J. Vac. Sci. Technol., B 17(5) 2074 (1999).

* cited by examiner

Tip array fabricated by RIE using CsCl as a resist

Pillars with CsCl caps still in place. Bar length is 10 microns; view at 70° to normal.

CsCl hemispheres on SiO$_2$, the whole coated in Al.
(mag. 7.5; 10 micron bar)

CsC1 removed exposing SiO$_2$ and leaving the rest of
the Al film. (mag.20K; 1 micron bars)

*Wells in SiO₂ on Si. The Al layer coats the oxide.
(viewed at 45°, mag 20K; 1 micron bars)*

*Wells in SiO₂, the Al layer is clearly visible
(mag 50K; 1 micron bars)*

| | |
|---|---|
| ⬚ | 1. Crystalline overgrowth |
| ⬚ | 2. Heavily dislocated region |
| ⬚ | 3. Silicon dioxide |
| ⬚ | 4. Crystalline substrate |

SUBSTITUTE SHEET (RULE 26)

PROCESS FOR MAKING AN ARRAY OF WELLS

This application claims the priority benefit of U.S. application Ser. No. 10/049,736, filed Jul. 22, 2002 and still pending. That application is a Section 371 application of Serial No. PCT/GB00/03202, filed Aug. 17, 2000, which claims the priority benefit of United Kingdom Serial No. 9919479.7, filed Aug. 17, 1999, the disclosure of which is incorporated herein by reference.

This invention relates mainly, but not exclusively, to semi-conductor device fabrication, and in particular to methods of fabricating semi-conductor devices in materials such as silicon or gallium arsenide, or other III-V compounds and metal devices in tungsten, gold and silver.

Where it is required to produce semi-conductor or other devices requiring detailed patterns, on a single "wafer" of material, it is of course possible to produce such patterns, by means of methods such as electron-beam lithography or photolithography and successive masking stages. However, such methods do require quite complex equipment and preparations, particularly when it is required to make large arrays of very small devices, because this requires complex equipment and step and repeat strategies.

Consequently there is a need to be able to make (ca. 1 to 0.01 micron) feature size structures on semiconductor wafers and other thin solid substrates by a fast and practical method over large areas. With such a method it would for example be possible to make dense arrays of field emitting structures and other devices needing high densities of special features. The method of controllable island lithography is a solution to this problem.

The process of island lithography has several major process steps. The first major stage is the deposition of a thin film of a highly soluble solid onto the material on which the features are to be made; followed by exposure to a fixed vapour pressure of the solvent in which the deposited layer is soluble. Such treatment causes the deposited thin film to re-organise from being a thin film into an array of hemispherical islands. The second major processing stage is to employ these islands as resist in a reactive etching process so as to obtain arrays of pillar like structures or arrays of cones. The essential point about reactive etching is that it is directional, etching downwards on to the surface much faster than side wise. This is in contrast to simple liquid phase etching that is homogeneous in behaviour, etching equally in all directions at the point of contact.

One such system which has previously been proposed, depends on the effect that very thin films of cesium chloride deposited on a hydrophilic substrate when exposed to water vapour under controlled conditions will re-organise into a hemispherical island array. The characteristics of the array are that it is disordered and near to Gaussian in size distribution: the array is described by a fractional coverage (F) called "packing density", with islands of a mean diameter (<d>), having a particular standard deviation. This technique can be used as a well controlled process for producing island arrays of known characteristics on silicon surfaces, with mean diameters ranging from 30 to 1200 nm (ca.±17%). Distributions of such CsCl island arrays have previously been used[2] as a resist in the RIE (reactive ion etching, chlorine based) fabrication of mesoscopic pillar structures on n*GaAs. The measured photo luminescent spectra showed large band gap Increases arising from quantum confinement effects. There have been other proposed approaches to nano-scale lithography using condensation effects leading to self-organising systems[3-5], e.g. metal nuclei have been used to fabricate dense arrays of field emission tips[6,7].

The present invention relates to an important extension to this process that makes it more useful and versatile and involves the addition of a major process step between the deposition and etching processes which turns the overall process from a positive to a negative process.

Thus, the present invention can provide a method of device fabrication in silicon, silicon dioxide, gallium arsenide, indium antimonide and other etchable solids for the production of cones and wells.

Accordingly the present invention provides a method of electronic, optical or magnetic device fabrication in which "negative" regions for defining individual features of devices are formed by the steps of:

a) depositing a very thin film of a highly soluble solid onto a flat hydrophilic substrate;

b) exposing the film to solvent vapour under controlled conditions so that the film reorganises into an array of discrete hemispherical islands on the surface;

c) depositing a film of a suitable resist material over the whole surface;

d) removing the hemispherical structures together with their coating of resist leaving a resist layer with an array of holes corresponding to the islands; and e) subjecting the resulting structure to a suitable etching process so as to form a well at the position of each hole.

The highly soluble solid may be a salt such as cesium chloride, in which case the solvent used will be water. The substrate may for example be an $SiO_2$ layer on Si, or gallium arsenide or indium antimonide. Preferably the resist material is aluminium which is vapour-deposited, and in a preferred embodiment of the invention, the removal of the coated hemispherical structures is achieved by submerging the structure in an ultrasonic agitation bath filled with solvent that has the effect of dissolving the islands and thus removing the thin layer of material in which they were coated, leaving a perforated film over the rest of the substrate, namely covering the "ocean" area in which the islands are located This process step is known as a "lift-off" process. This perforated film whose holes correspond to the now removed islands can act as a resist in an etching process.

The etching may be by reactive ion etching whereupon the holes in the resist are etched to make well like structures. In this negative resist case it is also possible to use laser assisted etching to make well like structures because laser etching is directional, etching faster in the direction of the laser beam than sidewise to the beam.

A variant to the "lift-off" process described above is to add directionality, so creating an anisotropic system. If instead of depositing a resist film over the islands and substrate by direct downwards evaporation the vapour stream is directed at an angle that is a grazing angle to the substrate, the islands will cast a deep shadow in which there will be no deposition of material. In this way the holes in the film remaining after "lift-off" will be oblong, nearly elliptical, in shape and all with their long axis in the same direction. The wells made by etching will follow the shape of these elliptical holes in the thin film resist. It is a step in the fabrication of certain anisotropic composite materials.

The first application of this island resist method as a positive resist scheme was in the fabrication of arrays of pillars in gallium arsenide. In this case a thin layer of cesium chloride was thermally evaporated onto a wafer of gallium arsenide whose surface had been treated so that it was hydrophilic. The coated wafer was placed in a chamber at a controlled vapour pressure of water for a fixed period of time. This treatment causes a multi-layer of water to condense on the surface of the cesium chloride and also the substrate when it becomes unmasked. The island array develops and grows as a result of the presence of this liquid layer in which the cesium chloride is soluble. The resulting island array has a certain average island diameter and a population of islands with a Gaussian distribution and a particular width at half full height and a particular packing density.

Some embodiments of the invention will now be described by way of example with reference to the accompanying illustrations in which:

FIG. 7b is a perspective view of a sectioned well in the structure of FIG. 7a.

Methods of CsCl island fabrication are explained in detail in references (1) and (2). Briefly the silicon substrate coated In native oxide (both n- and p-type samples can be used) are etched and washed so as to give a reproducible hydrophilic surface. CsCl is evaporated on the surface. The CsCl coated substrate is then transferred (under dry conditions) to a chamber of fixed water vapour pressure. The thin film of CsCl develops into an island array of hemispheres whose dimensional characteristics depend upon initial thickness, water vapour pressure and time of development. The developed substrate is transferred to the scanning electron microscope under unchanged humidity, where the island array can be photographed for measurement.

Tip Fabrication

Figure 1A:
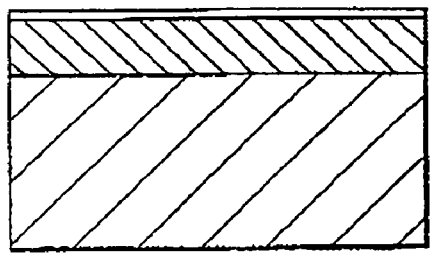
FIG. 1a illustrates the deposited layer of CsCl on the $SiO_2/Si$.
Figure 1B:
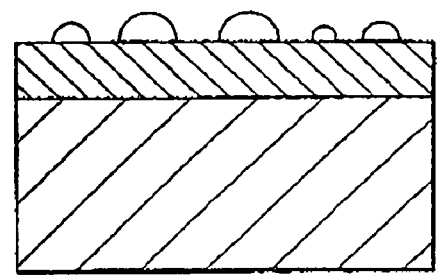
FIG. 1b illustrates the formation of CsCl islands on the substrate.
Figure 1C:
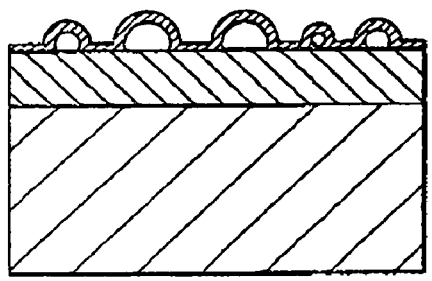
FIG. 1c shows the formation of an Al film over the structure of FIG. 1b.
Figure 1D:
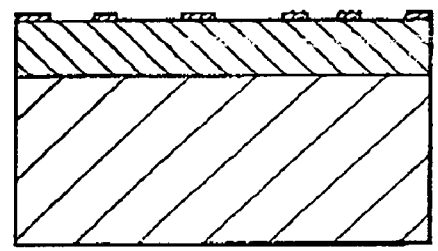
FIG. 1d shows the structure of FIG. 1c after ultrasonic agitation.
Figure 1E:
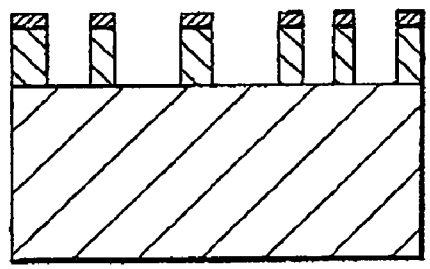
FIG. 1e shows the effect of subjecting the structure of FIG. 1d to RIE.
Figure 2:
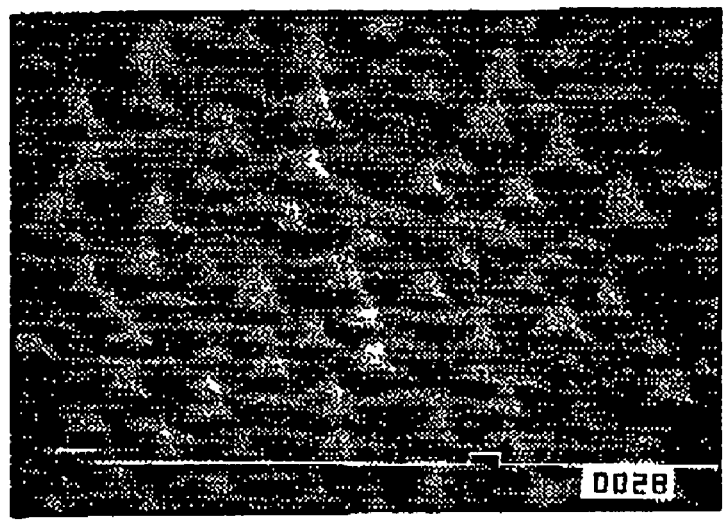
FIG. 2 is a perspective view of a "tip-array" formed using CsCl as resist.

The tip fabrication illustrated In FIG. 2 resulted from using the humidity value of the prevailing laboratory conditions (40%) and the CsCl thickness and development time were then chosen to give the desired distribution. The development time was the time elapsed from removing the CsCl coated silicon from the deposition chamber to the RIE chamber at the moment of its pump down. The fabrication of tips was carried out on n-type and p-type silicon substrates of {100} orientation as described above. Etching was carried out in equipment obtained from Oxford Plasma Technology (model RIE80, fitted with a 6.5" table), The conditions for island growth were:—CsCl thickness 66 Å; relative humidity 40%; and 5 min. exposure time. This resulted in an array of hemispherical islands with packing density 0.18, and mean diameter 850 Å±200 Å. This CsCl/Si system, placed upon a silica glass plate in the RIE apparatus, was etched for 3 minutes in a gaseous mixture made by combining $O_2$: Ar: $CHF_3$ in a ratio of flow rates of 1: 10:20 sccm. The total chamber pressure was 40 millitorr, the total rf power was 155 watts and the dc bias was 400 volts. This process resulted in the tip array shown on FIG. 2. For these conditions we measured a tip angle of ca. 28° The tip diameter is not observable in our sem. and must be <100 Å.

Figure 4:
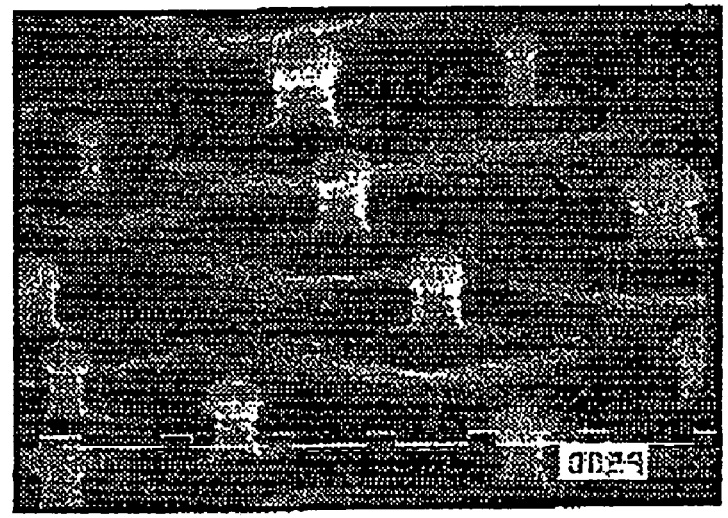
FIG. 4 is a perspective view of pillars formed by CsCl hemispheres acting as resist.
Figure 3:
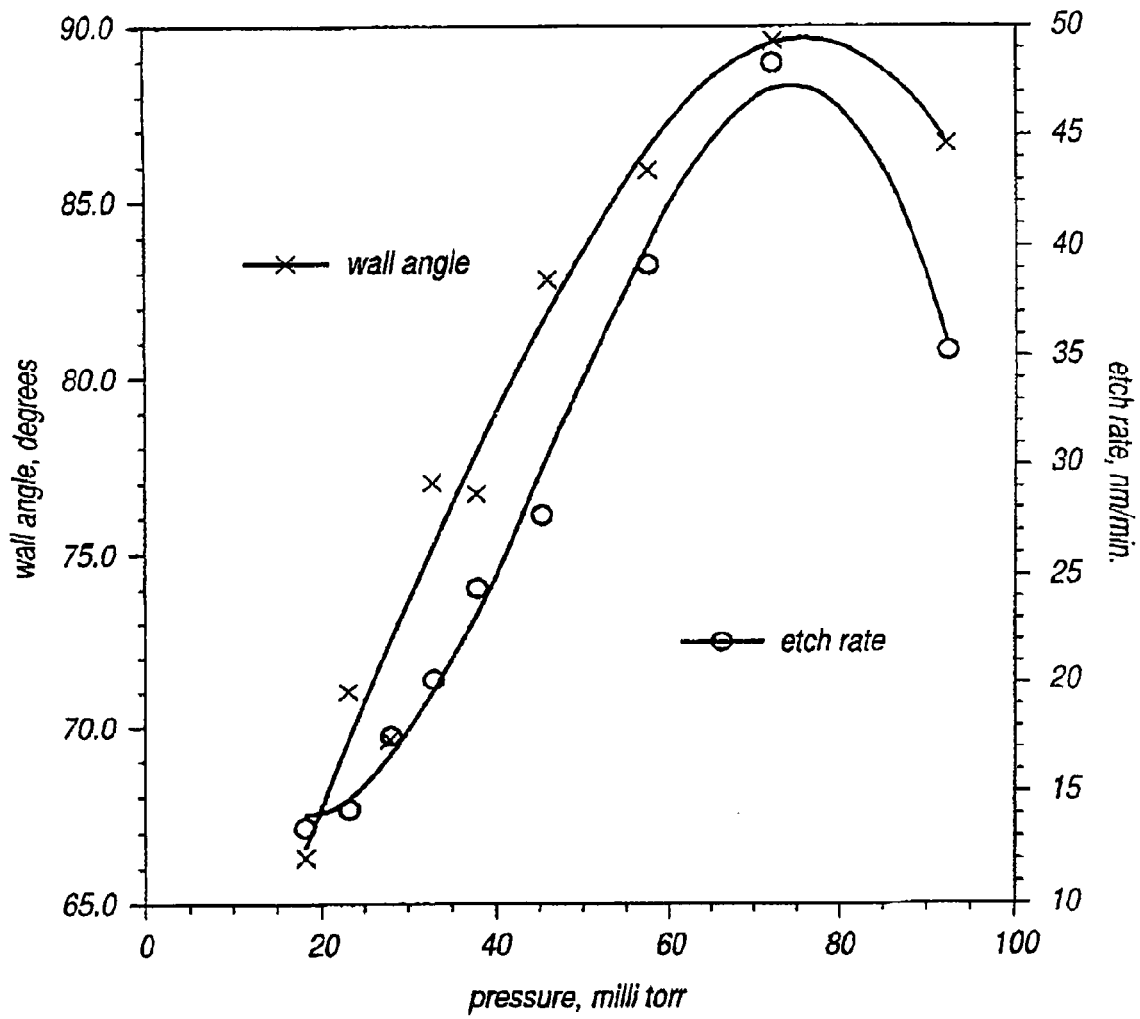
FIG. 3 is a graph of wail-angle and etch-rate.

It is possible to form regular cones with a required wall angle (the angle that the side makes with the horizontal) by controlling the etching process. FIG. 3 shows the wall angle as a function of total pressure for a 1:10:20 mixture; average power 61 watts; 300 dc bias. The relation of wall angle to some of the other independent variables is not shown, but the trends are as follows. There is an increasing etch rate with increasing do bias; comparative insensitivity to Ar flow rate, at least for plus/minus a factor of two in flow-rate; and, wall angle and etch rate both increase with increasing $CHF_3$ flow rate. When the total pressure is in excess of 75 millitorr we observe rough surfaces and the on-set of a component of horizontal silicon etching, as evidenced by under-cutting of the CsCl: this is shown in FIG. 4, for which the etching conditions were: 1:10:20 mixture; total pressure 87 millitorr; 73 watts; 300 volt do bias; 15 mins. etching time. In general it can be seen that there is a shallow depression in the substrate around each pillar or tip. This shallow "trenching" can be ascribed to enhanced, proximity, sputtering arising from ions scattered from the vertical features[8].

Well Fabrication

The procedure for well fabrication, cf. FIG. 1, is first to grow the CsCl island array on $SiO_2$ on Si: here we are interested in larger hemispheres, in the 0.5 to 1 micron range. A film of Al is then evaporated over this structure, and the Al film that coated the CsCl hemispheres is then caused to lift off, by means of ultrasonic agitation in water. The remaining Al can then act as a resist, enabling holes to be etched in the $SiO_2$.

Figure 5:
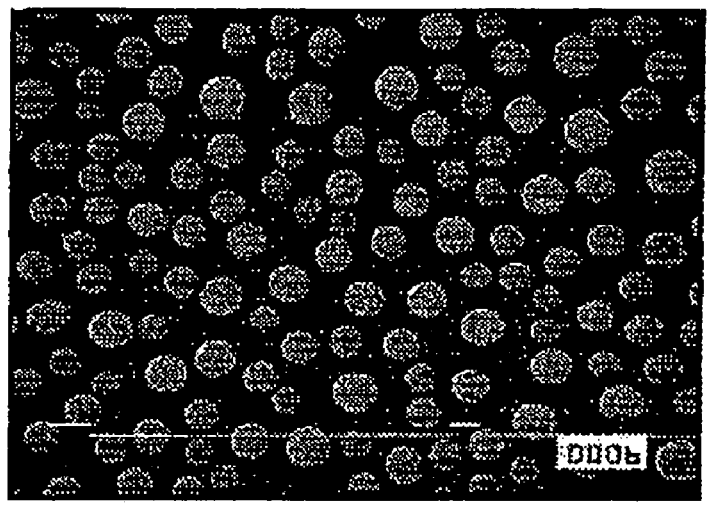
FIG. 5 is a plan view of an array of CsCl hemispheres coated with Al.
Figure 6:
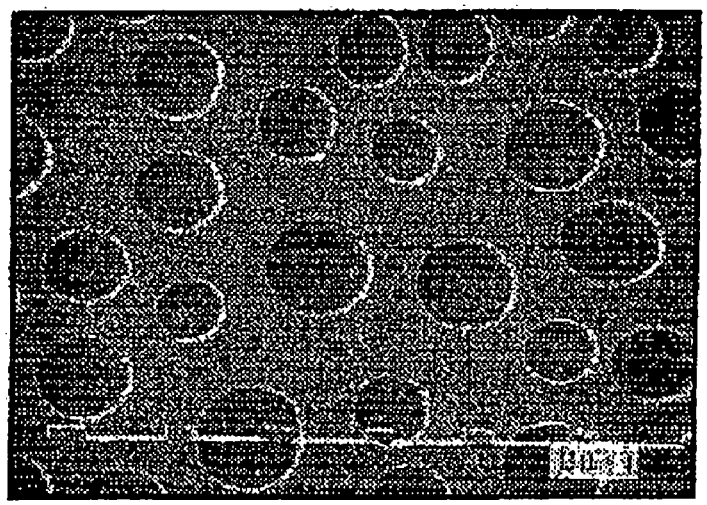
FIG. 6 shows the array of FIG. 5 after removal of the hemispheres.
Figure 7A:
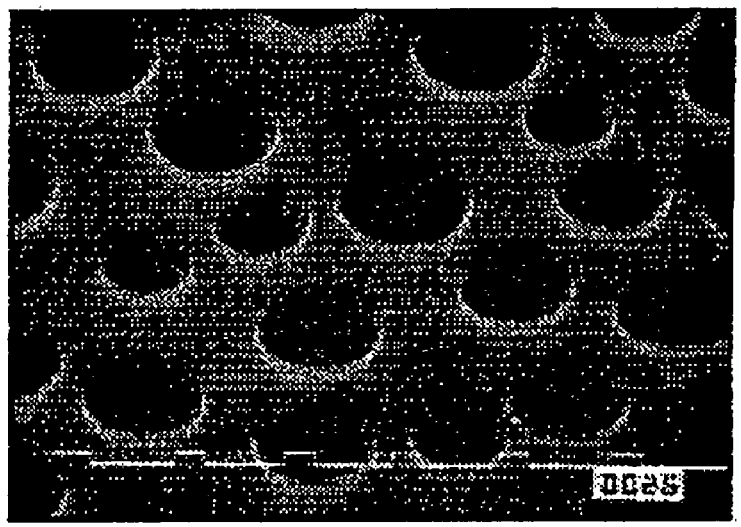
FIG. 7a is a perspective view of wells formed in $SiO_2$ on Si.
Figure 7B:
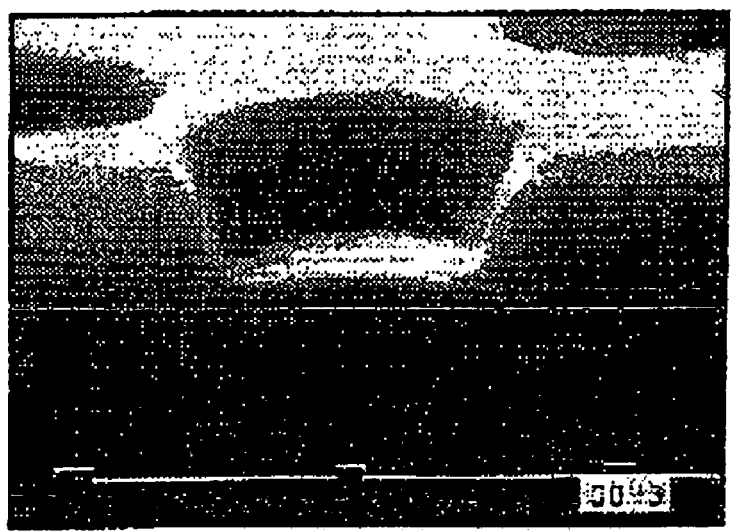

In order to grow large hemispheres of CsCl comparatively thick films of CsCl are needed and it is necessary to expose these films to a relatively high humidity. As an example: using 1350 Å thick CsCl, developed at 55% relative humidity for 92 hrs., gave an average hemisphere diameter of 9200±1460 Å and a packing density of 35.4%. FIG. 5 shows the CsCl islands coated by a 1050 Å thick Al film. This array was made on a thermally grown oxide on silicon: the hydrophilic oxide was 3200 Å thick. On to this $CsCl/SiO_2$ surface was evaporated pure Al to a thickness of 1060 Å. The Al coated structure was ultrasonically agitated for 2 minutes. The result was the complete removal, i.e. lift-off, of the Al which covered the CsCl, leaving an Al coating with an array of holes matching the developed CsCl array, as shown on FIG. 6. This structure was subjected to RIE using Oxford Plasma Technology equipment (model RIE80, fitted with a 6.5" table). The $Al/SiO_2/Si$ system was placed upon a silica glass plate in the RIE apparatus under the following conditions:—feed-gas 10:20 sccm ($Ar:CHF_3$); total pressure 5 millitorr, at 160 watts and 220 dc. bias for 5 mins.: the resulting well structure is shown in FIGS. 7a and b.

There are a number of possible variations in the materials and methods described above. For example the composition of the layer forming the substrate for CsCl growth could also be $WO_3$ or $Si_3N_4$. The layer formation method for $SiO_2$ is preferably thermal oxidation at a temperature of 1050-1350° C. for 1-8 hours, with an $O_2$ flow rate of 0.5-3 litres per minute. Alternatively the layer can be formed by sputtering with a plasma gas comprising Ar and/or $O_2$ and/or $N_2$, with RF power of 30-200 W for a period of 0.5-30 minutes, the target being either $SiO_2$, Si or W. The chamber pressure can be 1-50 m Torr.

The formation of the CsCl hemispheres can be done under a range of conditions, e.g.

| | |
|---|---|
| chamber pressure: | $5 \times 10^{-5}$ to $1 \times 10^{-3}$ Pa, |
| evaporation rate | 0.2-50 angstrom/sec |
| substrate temperature | −30 to +30 deg C. |
| thickness | 1-200 nm |
| ripening relative humidity | 0.63% |
| ripening time | 5 min-60 days | angle between substrate surface and base of hemisphere wail: up to 90 degrees.

The resist layer can also be of various alternative materials to Al, e.g. Cr, Au, $SiO_2$, $Si_3N_4$, and may be formed by vacuum evaporation or sputtering as appropriate. In the case of vacuum evaporation, this will normally be done at a chamber pressure of between $5 \times 10^{-5}$ and $1 \times 10^{-3}$ Pa, an evaporation rate of 0.2-50 angstrom/sec, and a substrate temperature of −30 to +200° C. In the case of sputtering, the plasma gas used would be Ar and/or $O_2$ and/or $N_2$ and the RF power 30-200 W for a period of 0.5-30 minutes. The target could be Al, Cr, Au, $SiO_2$ or Si, and the chamber pressure 1-50 m Torr.

The ultrasonic agitation process can also be carried out under a range of different conditions. The preferred frequency range is 24-100 kHz, power 13-130 W and power density 0.05-0.5 W/cm². The time take for the ultrasonic agitation to be effectively completed may be between 5 seconds and 60 minutes, and the preferred solvent is water.

When the evaporation of the resist material is carried out at a grazing angle, this may vary between 15 and 90 degrees to the surface and the major/minor axis ratio of the ellipsoids thus formed will of course depend on this angle, but is generally up to 4-1.

The rate between the resist (Al) thickness and the CsCl mean diameter must be less than 0.2, and will generally be in the range of 0.005-0.2.

Discussion

Cesium chloride is eroded by physical sputtering processes only, while the silicon is finally chemically removed. The selectivity, which is the rate of silicon etching to that of the cesium chloride, can be determined from the physical characteristics of the tip structures. Several possible cases can be considered. For the case that the sputtering rate, $\omega$, of CsCl is uniform over the surface of the hemisphere, the time, T, for removal of a hemisphere of initial radius $R_o$ is, $$T = R_o / \omega$$

While the resist is being sputtered away the silicon is being etched vertically, at a rate v, so that a conical structure results in the Si. The height, H, of the right regular cone will be.

$$H = R_o v / \omega$$

The cone ("tip") angle $\phi$ is $$\phi = 2 \tan^{-1}(\omega/v) = 2 \tan^{-1}(R_o/H)$$

For example, we have measured an average $\phi = 28°$, this gives a value of $\omega/v = 4$, which is the selectivity. For the case where sputtering of CsCl is only by vertical removal, at rate $\alpha$, the rate term $\omega$ is replaced by $\alpha$ in the above equations.

For vertical and horizontal CsCl sputtering (the latter being uniform in the plane parallel to the substrate) the relations are, $$T = R_o / (\alpha^2 + \eta^2)^{1/2}$$

where $\eta$ is the horizontal rate: and the tip angle is, $$\phi = 2 \tan^{-1}\left(\frac{(\alpha^2 + \eta^2)^{1/2}}{v}\right)$$

Thus the present invention enables the fabrication of pillars and cones of silicon in high packing density and of dimensions in the tens of nm region.

Furthermore wells in silicon dioxide on silicon can be made by a lift-off process, again in high packing density. The relation of wall angle to process parameters in the RIE technique have been investigated and shown to be capable of control over a useful range of angles.

The wells formed by the lift-off process can be used to facilitate the formation of various other types of devices, particularly semiconductor devices. One specific application for which it has been found particularly useful is in the fabrication of crystalline semiconductor heterostructures In which the lattice constants of the two component materials differ by less than ½% Presently, these are usually formed by mismatched epitaxial methods.

In such "strained layer" systems (SLS) the epitaxial layers of the two components are thinner than the critical thickness for the formation of misfit dislocations with the result that the layers remain "pseudomorphic", i.e. the atoms on either side of the interface remain in registry. In this case the "in-plane" lattice constants remain the same and the resulting strain can be deliberately used to modify the band structure of the system. With SLS the materials are generally chosen (eg. GaAs and AlAs) so that the lattice mismatch is relatively small so that quite thick layers can be grown-without dislocations forming.

In many other cases, it may desirable to combine materials with very different electrical, magnetic or optical properties despite the large mismatch precluding pseudomorphic growth for more than a few monolayers (i.e. when the mismatch in lattice constant exceeds about one percent). In this case the strain is relieved in the interface region by the formation of a high density of misfit dislocations. A critical thickness results which, when exceeded, causes the film to return to its natural lattice constant as this is the lower energy state for the system. A very high density of misfit dislocations $-10^{11} cm^{-2}$) forms close to the interface. The dislocation density then falls to $-10^7 cm^{-2}$ after growth has continued for a few microns and the film Is then almost completely relaxed.

The effect of the dislocations formed near to interfaces or the resultant threading dislocations which can spread throughout the film is to degrade the electrical and optical properties of the semiconductor. For example the electron mobility in InSb (the semiconductor having the highest mobility yet reported at room temperature of 78,000 cm²/Vs) can become as low as 100 cm²/Vs as measured by the Hall effect in a 10 nm InSb film grown on a GaAs substrate[10] (the lattice mismatch is 14% for this system). InSb is the favoured material for magnetoresistive or Hall sensors whose performance can consequently be severely reduced. The dislocations also act as electron-hole recombination centres and therefore limit minority carrier lifetimes, spoil transistor action and also act to prevent lasing and reduce LED and photo-detector efficiencies. Dislocations can also act as shorting paths through p-n tunnel junctions, thereby degrading current voltage characteristics. The movement of dislocations induced by strong biasing electric fields can lead to the catastrophic failure of lasers and other devices.

Apart from InSb/GaAs there are many examples of semiconductor material systems where the formation of misfit dislocations at interfaces presents severe problems and prevents the full exploitation of otherwise admirable properties; particularly the $Si/Si_{1-x}Ge_x$ system which offers the prospect of a new generation of Si based devices and the GaN related system, presently being developed for blue and uv solid-state light sources where no lattice matched substrates exist. Other examples of materials combinations are InAs on GaAs where GaAs is chosen for substrates because of their cheapness and their electrically insulating properties; and the growth of compound semiconductors such GaAs on Si where the aim is to integrate optoelectronic, photonic or microelectronic devices on the same chip.

In order to obtain reasonable electrical and optical quality in mismatched films, film thicknesses exceeding ten microns may need to be grown. This is expensive and time consuming and may be undesirable for other reasons; e.g. leading to high device capacitances or preventing the use of the material sub-micron sensor applications.

Alternatively complex growth routines are introduced to minimise the dislocation formation. Two recent examples[11] of this for the InSb/GaAs system are (i) the deposition of the first 10 monolayers at much reduced temperature (310° to 325° C. compared with 380°-400° C.) so that the extent of the island growth mode can be restricted to 22 nm (ii) the use of substrates of non-standard orientation where the growth mode and rate can be very different.

Another variation has been to grow the semiconductor on a substrate lithographically patterned with ridges or islands with the minimum feature size being of the order of one micron. If this characteristic length is smaller than the separation between threading dislocations, the local film quality then can approach that of the bulk material.

Recently a different approach has been demonstrated for the Si/Ge heterostructure combinations[12]. As the first step an amorphous silicon dioxide film is deposited on a crystalline silicon substrate. Holes of diameter 100 nm are then opened up in the oxide and Ge is selectively grown on the Si within the exposed areas. The threading dislocations are bent and blocked by the oxide sidewalls and the interfacial misfit dislocations are buried within the holes. Chemical selectivity prevents the growth of the germanium directly an the oxides and a continuous film of Ge is eventually formed by sidewards epitaxial overgrowth of the material from the region of the holes. The depth, spacing of the holes and wall angle are all critical parameters. For dislocation trapping to succeed the holes must be relatively deep whereas an increase in separation decreases the strain in the film when the islands coalesce. Successful selective epitaxy of germanium on silicon through windows in silicon been demonstrated previously by a number of groups (e.g.[13,14]) as has similar lateral epitaxial overgrowth on GaN[15,16,17].

In these earlier proposal the holes in the oxide were formed either using interferometric lithography[12] or electron beam lithography[13,14]. Instead it is possible to use the process of island lithography combined with liftoff procedures as a simpler and cheaper alternative fabrication method. This method offers the possibility of much greater flexibility in packing-densities and well-diameter together with the ability to cover larger areas at lower cost.

Figure 8A:
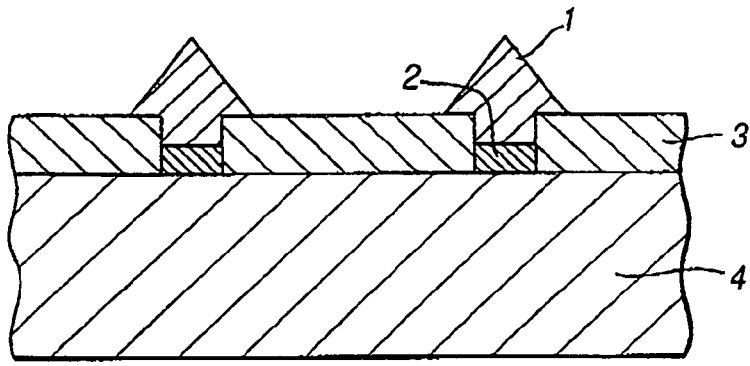
FIG. 8 shows further examples of structures formed by using the methods of the invention.
Figure 8B:
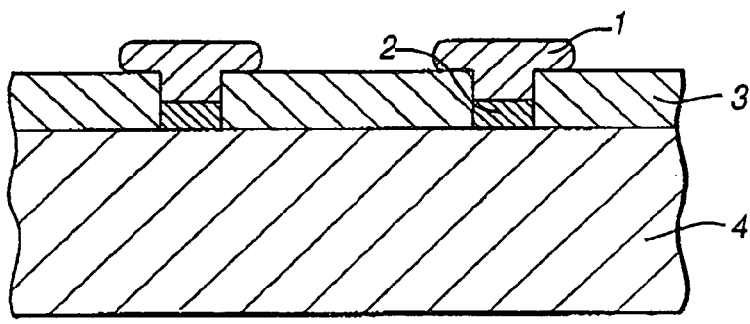
Figure 8C:
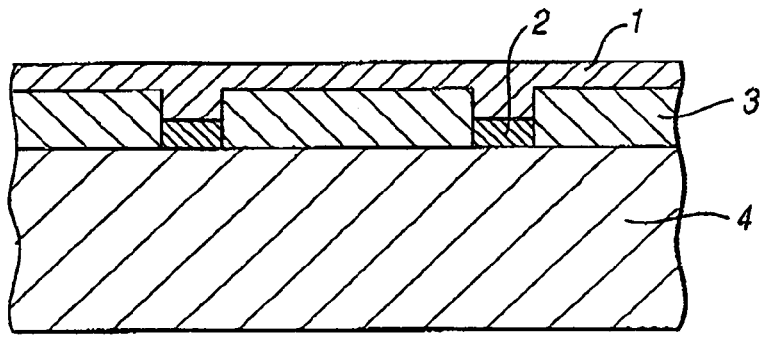

FIG. 8 shows the three different structures which can be formed by varying the amounts of lateral overgrowth initiated from holes in thin silicon dioxide films. FIGS. 8(a) and 8(b) are examples of "Island" formations while FIG. 8(c) shows a continuous film. In each case, a silicon dioxide layer 3 is grown on a crystalline substrate 4, and holes are created by the lithographic process described in references[18-22].

This consists of (a) cesium chloride island deposition on the silicon dioxide coated substrate (b) aluminium film deposition on the surface (c) lift-off of the cesium chloride exposing the corresponding regions of the silicon dioxide (d) wet or dry etching of the silicon dioxide to create holes through to the crystalline substrate (e) removal of the aluminium film. The crystalline overgrowth (1) is initiated at the bottom of these holes where a high density of dislocations (2) is formed.

References[13-17] are concerned with a method of reduction of dislocation densities during the growth of crystalline germanium on silicon or GaN on mismatched substrates. The method is directly applicable to other semiconductor heterostructures. The technique of growth through holes in a thin silicon dioxide film can in principle also be extended to improve the interface region between disparate crystalline materials systems such as metal/semiconductor, semiconductor/insulator or even metal-metal or metal-insulator combinations.

With metal/semiconductor structures the crystalline metal could either be a conventional soft metal[23,24], or the more brittle compounds such as $MnAs$[25,26], $MnSb$[27], $NiMnSb$[28,29,30], $PtMnSb$[29], $CuMnSb$[29], $LnPdSb$[31], $Co_2MnGe$[32] or $CrO2$[33,34]. The latter are of interest because of their magnetic properties and are more likely to be susceptible to mechanical problems at the interface such as microcracking and the formation of misfit dislocations.

Crystalline semiconductor/insulator heterostructures are mainly of interest because of the need to make highly perfect gate dielectrics or because of the drive to integrate optical waveguides and circuitry, or surface acoustic wave (SAW) delay lines with microelectronic devices. Often a high dielectric constant (relative permittivity) is desirable for these applications. The insulators are usually oxides; e.g. strontium titanate where good quality films have been grown on $Si$[35], $KtaO_3$, $BaTiO_3$, $TiO_2$, $LiNbO_3$ and lead lanthanum zirconate titanate (PLZT).

The discussion so far has been concerned with the production of smooth and continuous crystalline films. Also of interest is the possibility of the growth of crystalline metallic "nanomagnets" at controlled separations. Nanocrystalline magnets can often be formed rather than smooth continuous film by varying the growth conditions to produce island growth or by subsequent annealing: e.g. $MnA_s$[36], $MnSb$[37,38,39] and $ErAs$[40].

The examples selected are not inclusive of all possible applications. Any deposition procedure which results in the formation of crystalline films can in principle be used (e.g. sputtering, evaporation, laser ablation etc) although epitaxial techniques are more likely to produce good results. The most common of these are Molecular Beam Epitaxy (MBE), Metallo-Organic Vapour Phase Epitaxy (MOVPE), Liquid Phase Epitaxy (LPE) and variants. In order to produce substantial lateral overgrowth over the silicon dioxide or other suitable mask MOVPE—may be preferred on account of its high chemical selectivity.

REFERENCES

1. Mino Green and S. Tsuchiya, Submitted for Publication.
2. Mino Green and M. Garcia-Parajo, F. Khaleque and R. Murray, Appl. Phys. Lett., 63, 264 (1993).
3. H. W. Deckman and J. H. Dunsmuir, Appl. Phys. Lett., 41, 377 (1982).
4. H. Feng, R. Zella and P. J. Stiles, Appl. Phys. Lett 55, 1433 (1989).

5. C. Haginoya, M. Ishibashi and K. Koike, Appl. Phys. Lett., 71, 2934 (1997).
6. A. A. G Driskill-Smith, D. G. Hasko and H. Ahmed, J. Vac. Sci. Technol B, 15, 2773(1997).
7. A. A. G. Driskill-Smith, D. G. Hasko and H. Ahmed. Appl. Phys. Lett., 71, 3159 (1997).
8. Francois Foulon and Mino Green, Laser projection patterned etching of (100) GaAs by gaseous HCl and $CH_3Cl$, Appl. Phys A, 60, 377-381 (1995).
9. H. Dimigen and H. Luthe, Philips Tech. Rev., Rev., 35, 199 (1975).
10. Novel Semiconductor Material prepared by MBE & MOCVD R. A. Stradling Invited Talk at EPS Condensed Matter Conference (Lisbon) Physica Scripts T35 237-244 (1991).
11. Two dimensional growth of InSb thin films on GaAs (111) A substrates K. Kamisawa, H Yamaguchi & Y Hirayama App Phys Lett 76 589 (2000).
12. High quality Ge on Si by Epitaxial Necking T A Langdo, C W Leitz, M T Currie, E A. Fitzgerald, A Lochtefeld & D A Amoniadis Applied Physics Letters 76 3700 2000
13. Si/Si Ge dots grown by selective epitaxy L Vescan. C Dicker, A Hartman & A van der Hart Semiconductor Science & Technology 9 387 (1994)
14. Selective epitaxial growth of dot structures on patterned Si substrates by gas source molecular beam epitaxy E S Kim N Uami & Y Shiraki Semiconductor Science & Technology 14 257 (1999)
15. Lateral epitaxy of low defect density GaN layers via organometallic vapour phase epitaxy O Nam, M Bremser, T A Zhalova & R F Davis APL 71 2638 (1997)
16. Selective area and lateral epitaxial overgrowth of III-N materials by metal organic chemical vapour deposition J Park. P A Grudowski, C J Eitnig & R D Dupuis APL 73 333 (1998)
17. Pseudoepitaxy of gallium nitride thin films K Linthielum, T Gehrke, D Thomson, E Carlson, P Rejagopal, T Smith, D Batchelor & R Davis APL 75 196 (1999)
18. Mesoscopic Non-magnetic semiconductor magnetoresistive sensors fabricated with island lithography, M. Green, K Sassa, S A Solin, R A Stradling and S Tsuchiya, US Patent Pending
19. Shin Tsuchiya, Mino Green and R R A Syms, "Structural Fabrication Using Cesium Chloride Island Arrays as Resist in a Fluorocarbon Reactive Ion Etching Plasma", Electrochemical and Solid-State Letters 3, 4464 (2000)
20. M. Green, M Garcia-Parajo, F Khaleque and R Murray, "Quantum pillar structures on n+gallium arsenide fabricated using natural lithography", Appl. Phys. Lett 66, 264 (1993)
21. Mino Green and Shin Tsuchiya, "Mesoscopic hemisphere arrays for use as resist in solid state structure" J. Vac. Sci. & Tech. B. 17, 2074-2083 (1999)
22 F. Khaleque, "E-beam lithography and dry processing for sub-micron fabrication" PhD Thesis (Electrical Engineering Department Imperial College) University of London, 1990. M. F. Garcia-Parajo, "Natural lithography based on alkali-halide thin films for semiconductor sub-micron fabrication" PhD Thesis (Electrical Engineering Department, Imperial College) University of London 1993.
23. Single crystal Fe films groown on InAs (001) by molecular beam epitaxy Y B Xu, E T M Kernohan, M Teslepi, J A C Bland & S Holmes APL 73 399 (1998).
24. Ferromagnetic metal/semiconductor hybrid structures for magnetoelectronics Y B Xu, D J Freeland, E T Kernohan, W Y Lee, M Teslepi, C M Guertier, C A F Vaz, J A C Bland, S Holmes, N K Patel & D A Ritchie J App. Phys 85 5369 (1999).
25. Making Nonmagnetic Semiconductors Ferromagnetic H Ohno Science 281 951 (1998).
26 Growth control of MnAs on GaAs (001) by reflection high-energy electron diffraction F Schippan, M Kastner, L Daweritz & K H Ploog APL 76 834 (2000).
27. Influence of GaAs (001) surface termination on the n-plane magnetic anisotropies of MnSb epitaxial films H Akinaga, S Miyanishi, W van dRoy, J de Boeck & G Borghs APL 73 3285 (1998).
28. Deposition of high-quality NiMnSb magnetic films at moderate temperatures J A Caballero, Y D Perk, A Cabbibo, J R Childress, F Petroff & R Morei, J App Phys 81 2740 (1997).
29. Optical spectroscopy of half metallic ferromagnetic Heusler alloy thin films, PtMnSb, NiMnSb & CuMnSb J F Bobo, P R Johnson, M Kautzky, F B Mancoff, E Tuncci, R. L. White & B M Clemens J App Phys 81 4164 (1997).
30. Dielectric tensor for magneto-optic NiMnSb X Gao, J A Woollam, R D Kirby, D J Sellmyer, C T Tanaka, J Nowak & J S Moodera Phys Rev 59B 9965 (1999).
31. Antimonides with the half-Heusler structure; new thermoelectric materials K Mastonardi, D Yound, C C Wang, P Khalifah. R J Cava & A P Ramirez APL 74 1415 (1 999).
32. Epitaxial growth and magnetic properties of single crystal $C0_2MnGe$ Heusler alloy films on GaAs (001) T Ambrose, J J Krebs & G A Prinz APL 76 3280 (2000)
33. Highly spin-polarised chromium dioxide thin films produced by chemical vapour deposition from chromyl chloride W J DeSisto, P R Broussard, T F Ambrose, B E Nadgorny & M S Osofaky APL 76 3789 (2000).
34. Production and magnetotransport properties of $CrO_2$ films L Ranno, A Barry & J M D Coey J Apps Phys 81 5774 (1997).
35. Field effect transistors with $SrTiO_3$ gate dielectric on Si K Eisenbeiser, J M Finder, Z, Yu, J Randani, J A Curless J A Hallmark, R Droopsd, W J Ooms, L Salem S Bradshaw & C D Overgaard APL 76 1324 (2000).
36. Giant magnetoresistance in a low temperature GaAs/MnAs nanoscale ferromagnet hybrid structure P J Wellman, J M Garcia, J L Feng & P M Petroff APL 73 3291 (1998).
37. Room tempeerature thousand fold magnetoresistive change in MnSb granular films H Akinaga, M Mizuguchi, K Ono & M Oshima APL 76 357 (2000).
38. Crystallographic and magneto-optical studies of nanoscaled MnSb dots grown on GaAs M Mizuguchi, H Akinaga, K Ono & M Oshima APL 76 1743 (2000).
39. Room temperature photoinduced magnetoresistve effect in GaAs including MnSb nanomagnets H Akinaga, M Mizuguchi, K Ono and M Oshima APL 76 2600 (2000).
40. Fluctuation controlled hopping of bound magnetic polarons in Er:GaAs nanocomposites D R Schmidt, A G Petujkhov, M Foygel, J P Ibbotson & S J Allen Phys Rev Lett 82 823 (1999).
41. Controlling magnetic ordering in coupled nanomagnetic arrays R P Cowburn, A O Adeyeye & M E Welland New Journal of Physics 1 116.1-16.0 (1999).
42. Magnetisation reversal in long chains of submicronic Co dots J I Martin et al Applied Phys. Lett 72 255 (1998).
43. Thin Horizontal Plane Hall Sensors for ReadHeads in Magnetic Recording, S A Solin, R Stradling, T Thin and A J Bennett Meas Sci & Techn 8 1174 1181 (1997)
44. Narrow gap semiconductor Hall Sensors for ReadHeads in Magnetic Recording S A Solin, R A Stradling, J W Bennett & T Proc. Int Conf on Narrow Gap Semiconductors (Shanghai) World Scientific 1997 P249.

45. Thin Horizontal-Plane Hall Sensors for Read Heads in Magnetic Recording, J Bennett, S Solin, T Thio and R Stradling, U.S. patent application Ser. No. 08/781994.

The invention claimed is:

1. A method of forming an array of features, the method comprising:
   (a) depositing a film of a soluble solid onto a surface of a hydrophilic substrate;
   (b) exposing the film to a solvent so that the film reorganises into an array of discrete islands on the surface;
   (c) depositing a film of a resist material over the surface;
   (d) removing the islands, together with their coating of resist, leaving a resist layer with an array of holes corresponding to the islands; and
   (e) subjecting the resulting structure to an etching process so as to form a well at the position of each hole.

2. A method according to claim 1 in which the soluble solid includes a salt, and the solvent includes water.

3. A method according to claim 2 in which the solid includes cesium chloride.

4. A method according to claim 1 in which the substrate comprises an $SiO_2$ layer on silicon.

5. A method according to claim 1 in which the substrate comprises gallium arsenide, indium antimonde, indium antimonide or another semiconductor material.

6. A method according to claim 1 in which the resist material is deposited by evaporation, sputter deposition, or chemical vapour deposition.

7. A method according to claim 1 in which the resist material comprises aluminum.

8. A method according to claim 1 in which the removal of the islands is achieved by a lift-off process which comprises submerging the structure in an ultrasonic agitation bath filled with solvent, whereby the islands are dissolved and their coatings detached, leaving a perforated film over the remainder of the substrate to act as an etchant resist.

9. A method according to claim 1 in which the etching is achieved by directional etching such as reactive ion etching or laser etching to make well-like structures.

10. A method according to claim 1 in which the evaporation of resist material is achieved by directing the vapour stream at a grazing angle of incidence to the substrate, so that each island casts a shadow in which there is no vapour deposition, whereby the holes remaining in the film after removal of the islands will be elongated.

11. A method of forming a crystalline heterostructure comprising two component materials having different lattice structures, in which the materials are arranged to contact each other via a plurality of discrete regions, the method comprising the steps of:
   (a) forming a layer of the first material;
   (b) forming an insulating layer on the surface of the first material so as to provide a hydrophilic substrate;
   (c) forming holes in the insulating layer using the method of any one of claims 1 to 10; and
   (d) growing crystals of the second material on the first material in the regions exposed by the holes so as to form an island at the position of each hole.

12. A method according to claim 11 in which the crystal growth of the second material is continued until there is a continuous film extending over the insulating layer.

13. A method according to claim 11 in which the two component materials are both semiconductors.

14. A method according to claim 11 in which the two component materials are both metals.

15. A method according to claim 11 in which said two component materials comprise:
   (a) a metal and a semiconductor; or
   (b) a semiconductor and an insulator; or
   (c) a metal and an insulator.

16. A method according to claim 11 in which one of the materials is a metal compound comprising MaAs, MnSb, NiMnSb, PtMaSb, CuMnSb, LuPdSb, $CO_2MnGe$, or $CrO_2$.

17. The method of claim 1 wherein said islands are hemispherical.

18. A method according to claim 1 wherein the ratio between the resist thickness and the average diameter of the island is less than 0.2.

* * * * *